US005963729A

United States Patent [19]

Aji et al.

[11] Patent Number: 5,963,729

[45] Date of Patent: *Oct. 5, 1999

[54] METHOD FOR AUTOMATED ELECTROMIGRATION VERIFICATION

[75] Inventors: Sandeep A. Aji, San Francisco; Manjunath Doreswamy; Georgios Konstadinidis, both of Sunnyvale, all of Calif.

[73] Assignee: Sun Microsystems Inc., Palo Alto, Calif.

[ * ] Notice: This patent is subject to a terminal disclaimer.

[21] Appl. No.: 08/882,986

[22] Filed: Jun. 26, 1997

[51] Int. Cl.[6] ..................... G06F 17/50

[52] U.S. Cl. .................... 395/500.06; 438/468; 438/927; 257/767

[58] Field of Search .................... 364/488–491, 364/578; 257/767; 438/468, 927; 395/500.02–500.19

[56] References Cited

U.S. PATENT DOCUMENTS

| | | | |
|---|---|---|---|
| 5,349,542 | 9/1994 | Brasen et al. | 364/578 |
| 5,410,490 | 4/1995 | Yastrow | 364/488 |
| 5,535,370 | 7/1996 | Raman et al. | 395/500 |
| 5,774,371 | 6/1998 | Kawakami | 364/491 |
| 5,822,218 | 10/1998 | Moosa et al. | 364/488 |
| 5,828,580 | 10/1998 | Ho | 364/489 |
| 5,831,867 | 11/1998 | Aji et al. | 364/489 |
| 5,841,672 | 11/1998 | Spyrou et al. | 364/488 |

FOREIGN PATENT DOCUMENTS

| | | | |
|---|---|---|---|
| 05190690 | 2/1995 | Japan | G06F 17/50 |
| 05236863 | 4/1995 | Japan | H01L 21/82 |
| 0614094 | 11/1995 | Japan | G06F 17/50 |
| 08131125 | 11/1997 | Japan | H01L 21/66 |

OTHER PUBLICATIONS

Dalal et al. ("Design of an efficient power distribution network for the UltraSPARC–I microprocessor", Proceedings of the 1995 IEEE International Conference on Computer Design, VLSI in Computers and Processors, Oct. 2, 1995).

Li et al. ("Electromigration: the time bomb in deep–submicron ICs", IEEE Spectrum, vol. 33, No. 9, pp. 75–8, Sep. 1, 1996).

PTO 99–1710, Translation of Japanese Patent Application No. 6,104,094, Publication Document No. 07–311794, published Nov. 28, 1995, invented by Ishioka, Translated by Schreiber Translations, Inc., Mar. 1999.

PTO 99–1707, Translation of Japanese Kokai Patent Application No. 5,236,863, Published Sep. 22, 1993, invented by Minami, Translated by The Ralph McElroy Translation Company, pp. 1–62, Mar. 1999.

PTO 99–1709, Translation of Japanese Patent Application No. 5,190,690, Publication Document No. 07–44602, Published Feb. 14, 1995, invented by Kato et al., Translated by Schreiber Translations, Inc., pp. 1–18, Mar. 1999.

*Primary Examiner*—Kevin J. Teska
*Assistant Examiner*—Phallaka Kik
*Attorney, Agent, or Firm*—Jones Volentine, LLP

[57] ABSTRACT

An automated method detects electromigration violations in an integrated circuit design. Starting from the lowest hierarchy of the design so far completed, the parasitic (resistance and capacitance) component values extracted from a layout file are propagated up. Then, at the top-most level, lumping algorithms are employed to calculate the parasitic values for all of the top-most level nets. These values are then passed back down to the lower levels and then at each level, the layout is checked using previously computed parasitic values and EM limits. A peak current, AC-average current and AC-rms current are calculated for every layout, and then compared with the process EM rules for violations, in which the optimum line width and number of vias are specified for each interconnection.

3 Claims, 12 Drawing Sheets

START

Propogate Parasitic (R, C) Values From Lowest Hierarchy — 501

Retrive Top-Most Level Net Data — 502 ← B

Identify Drive Node(s) Of Each Net — 503

Collect Drive Strengths — 504

Lump Capacitance For Each Block — 505

Lump Capacitance Foe Ext. Net — 506

Lump Resistance For Each Block — 507

A

332

METHOD FOR AUTOMATED ELECTROMIGRATION VERIFICATION

BACKGROUND OF THE INVENTION

1. Field of the Invention

The present invention generally relates to the design and fabrication of integrated circuits, and more particularly, to electromigration verification in the design and fabrication of integrated circuits.

2. Description of the Related Art

Electromigration refers to the transport of mass in metals when stressed to high current densities. Electromigration occurs during passage of currents through thin metal conductors in integrated circuits. These thin metal conductors normally have sub-micron widths. Hence, metal piles up in some regions of the thin metal conductors and forms voids in other regions. The formation of voids in the thin metal conductors is very serious because such voids cause opens in the metal conductors which in turn cause the integrated circuit to fail. The pilling up or accumulation of metal in the thin metal conductors can also cause shorts between adjacent metal conductors which can also lead to circuit failure.

Electromigration sets a fundamental limit on the dimensions of conductors which carry current. The fundamental limit depends strongly on the choice of conductive material and its particular properties. Thus, the dimensions (e.g., width and height of the conductors) must be of a certain size to prevent, or at least minimize, failures due to electromigration for a particular fabrication process.

Conventionally, when preparing to fabricate an integrated circuit, process rules for a fabrication setup are used to specify the minimal dimensions and spacing that the conductors should have for the fabrication processing. The process rules are minimum values that are allowable to ensure proper fabrication of the integrated circuit. With respect to electromigration, the process rules pertain to dimensions or sizes of wires, contacts or other conductive features of the integrated circuit for different expected currents. If the circuit design satisfies the pertinent process rules, then failures due to electromigration are avoided or at least minimized.

Hence, before fabricating an integrated circuit, it is important to check that the circuit design does not violate the pertinent process rules. Although such checks could be done manually, manual checking is not practical because it is tedious, time consuming and susceptible to error. Chip assembly is an iterative process in which each step could require an EM check involving thousands of nets.

The conductors of the circuit design can carry either power or signals within the integrated circuit. Power lines tend to be in known locations with known current loads because a detailed analysis is usually performed when forming the power network. In contrast, signal lines tend to be plentiful and have complex routing and varying locations throughout the integrated circuit. Therefore, the checking of a circuit design for electromigration violations in signal lines is substantially more complex than for power lines. Here, even if manual checking were to be done on the signal lines (though often it is not), the checking would be incomplete, susceptible to error, and otherwise unacceptable. If manual checking fails to find one or more electromigration violations, the integrated circuits being fabricated would still fail and would have to be discarded or undergo revisions to the metal layers, both of which are costly.

At least one automated tool exists for checking power lines of an integrated circuit design against process rules for electromigration violations. PowerMill™ by Epic Design Technology, Inc. of Santa Clara, Calif. is such a product. However, since power lines tend to be in known locations with known current loads, the checking with respect to power lines can be accomplished. Nevertheless, the automated tool is unable to check signal lines against process rules for electromigration violations.

Thus, there is a need for an automated technique that is able to determine whether electromigration limits for a fabrication process are violated by signal lines within an integrated circuit design. To this end, related U.S. Pat. No. 5,831,867 filed Jun. 24, 1996, and entitled "METHOD AND SYSTEM FOR AUTOMATED ELECTROMIGRATION VERIFICATION", the entirety of which is incorporated herein by reference, describes an automated method and system for detecting electromigration violations in signal lines of an integrated circuit design to be fabricated. This computerized system and method are generally characterized by first identifying the driving nodes within the integrated circuit design, and then determining the drive strength of each driving node and a capacitance for each of the networks coupled to the driving nodes. Then, minimum dimensions of conductive signal traces of the integrated circuit design are determined by applying the drive strengths and capacitances to electromigration process rules. These minimum dimensions are compared with design dimensions to identify violations of the electromigration process rules in the integrated circuit design.

This system and method, while useful and far superior to manual techniques, nevertheless does suffer some drawbacks. One such drawback resides in the fact that the whole layout data base is taken as flat. That is, all functional boundaries are removed and net information is collected from the whole layout assuming the designer can see the entire chip layout. This technique treats all nets equally, regardless of their location or function within the chip layout. This in turn creates two distinct disadvantages. First, it is not possible to run the electromigration check until after design of the entire layout is completed. Second, due to the enormous number of nets found in a chip design, the processing time for checking the entire layout is prohibitively long. Typically, there may be on the order of five-hundred thousand or more nets on a single chip layout. The processing time needed to check for electromigration errors is so long as to discourage use of the tool each time a design variation is made to the chip layout.

SUMMARY OF THE INVENTION

Broadly speaking, the invention is directed to an automated system for detecting electromigration violations in signal lines of an integrated circuit design to fabricated. The automated system checks conductive traces (e.g., wires), vias and/or contacts that are used to route signals to and from various functional cells within the integrated circuit design against predetermined process rules to detect electromigration violations. The automated method and system according to the invention are able to find all electromigration violations and thus provides complete coverage which is far superior to conventional manual approaches.

The invention can be implemented in numerous ways. Several embodiments are mentioned below.

According to one aspect of the invention, a computer-implemented method is provided for detecting electromigration violations in an integrated circuit design, the integrated circuit design having a functional hierarchy including a plurality of top-most level functional blocks each containing a plurality of functional cells, a plurality of external networks each interconnecting two or more of the top-most level functional blocks, and a plurality of internal networks each contained within one of the top-most level functional blocks and each interconnecting two or more functional cells within the top-most level functional blocks, each of the external and internal networks including conductive traces and each of the functional cell having a drive strength associated therewith, said method comprising: providing electromigration process rules for conductive signal traces of the integrated circuit to be fabricated; propagating upward within the functional hierarchy parasitic resistance and capacitance values of conductive traces of the integrated circuit design; determining a lumped resistance, a lumped capacitance and a lumped drive strength of each of the external networks from the parasitic resistance and capacitance values; calculating at least one current value for each external network from the lumped resistance, the lumped capacitance and the lumped drive strength; determining minimum dimensions for the conductive signal traces of the integrated circuit design based on the at least one current value; determining design dimensions of the conductive signal traces within the external networks of the integrated circuit design; comparing the design dimensions with the minimum dimensions; and identifying violations of the fabrication process rules for the conductive signal traces of the integrated circuit design when the design dimensions are less than the minimum dimensions. The at least one current value includes a peak current, an average current and an rms current of each external network. The method further includes forming a top-level output error file that includes information concerning violations in a top-most level of the functional hierarchy of the integrated circuit design.

The parasitic resistance and capacitance values are extracted from a layout file. The resultant lumped resistance and capacitance values are used to devise a uniform RC model that provides more accurate results than the simple lumped model.

BRIEF DESCRIPTION OF THE DRAWINGS

The above and other objects and advantages of the present invention will be readily understood by the following detailed description, with reference to the accompanying drawings, in which:

FIG. 3(*b*) is a schematic diagram of a representative layout file 332;

DETAILED DESCRIPTION OF THE PREFERRED EMBODIMENTS

The invention pertains to an automated system for detecting electromigration violations in signal lines of an integrated circuit design to be fabricated. The automated system checks conductive traces (e.g., wires), vias and/or contacts that are used to route signals to and from various functional cells within the integrated circuit design against predetermined process rules to detect electromigration violations.

Embodiments of the invention are discussed below with reference to FIGS. 1–7. However, those skilled in the art will readily appreciate that the detailed description given herein with respect to these figures is for explanatory purposes as the invention extend beyond these limited embodiments.

Figure 1:
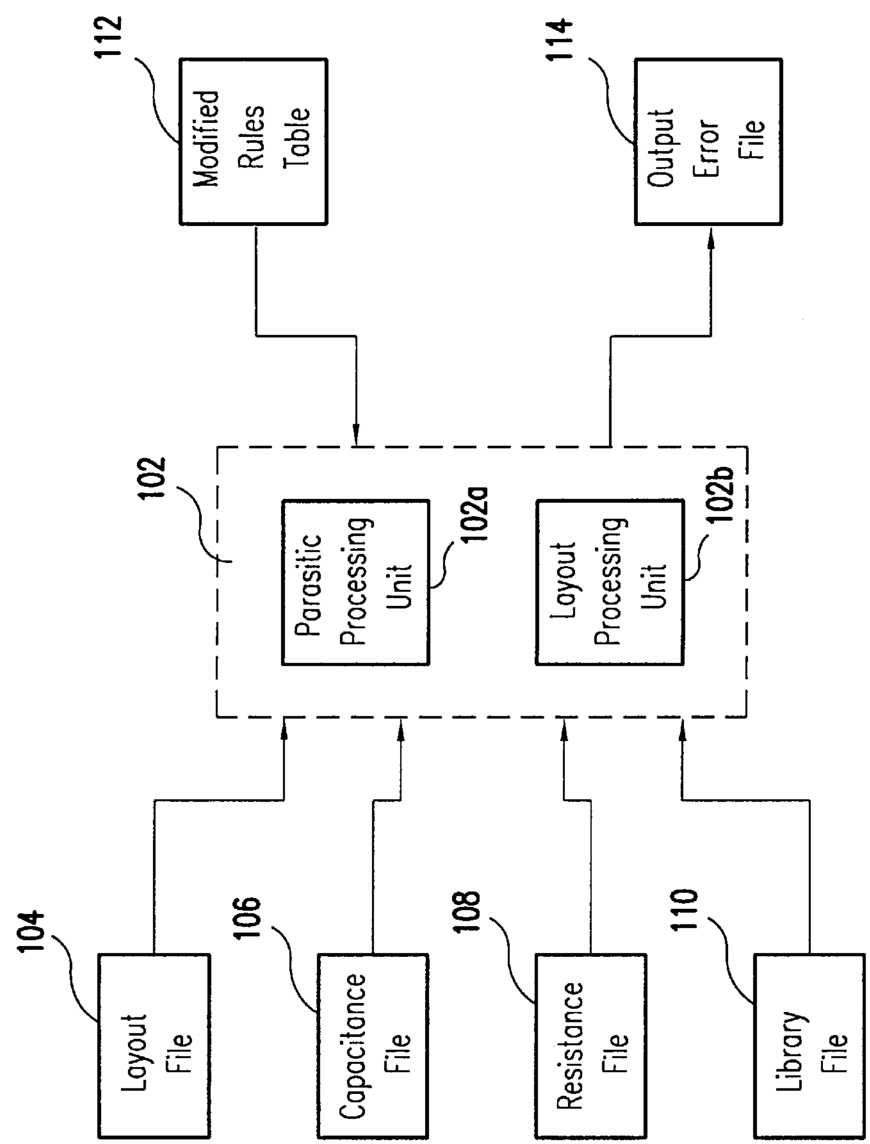
FIG. 1 is a block diagram of an electromigration check system according to an embodiment of the invention.

FIG. 1 is a block diagram of an electromigration check system 100 according to an embodiment of the invention.

As shown, the electromigration check system 100 includes a layout file 104 containing the design of the integrated circuit. The integrated circuit design includes various modules or blocks, and each module or block includes a large number of functional cells and nets. A net is made up of wires and contacts which interconnect the functional cells of the integrated circuit design.

Figure 2A:
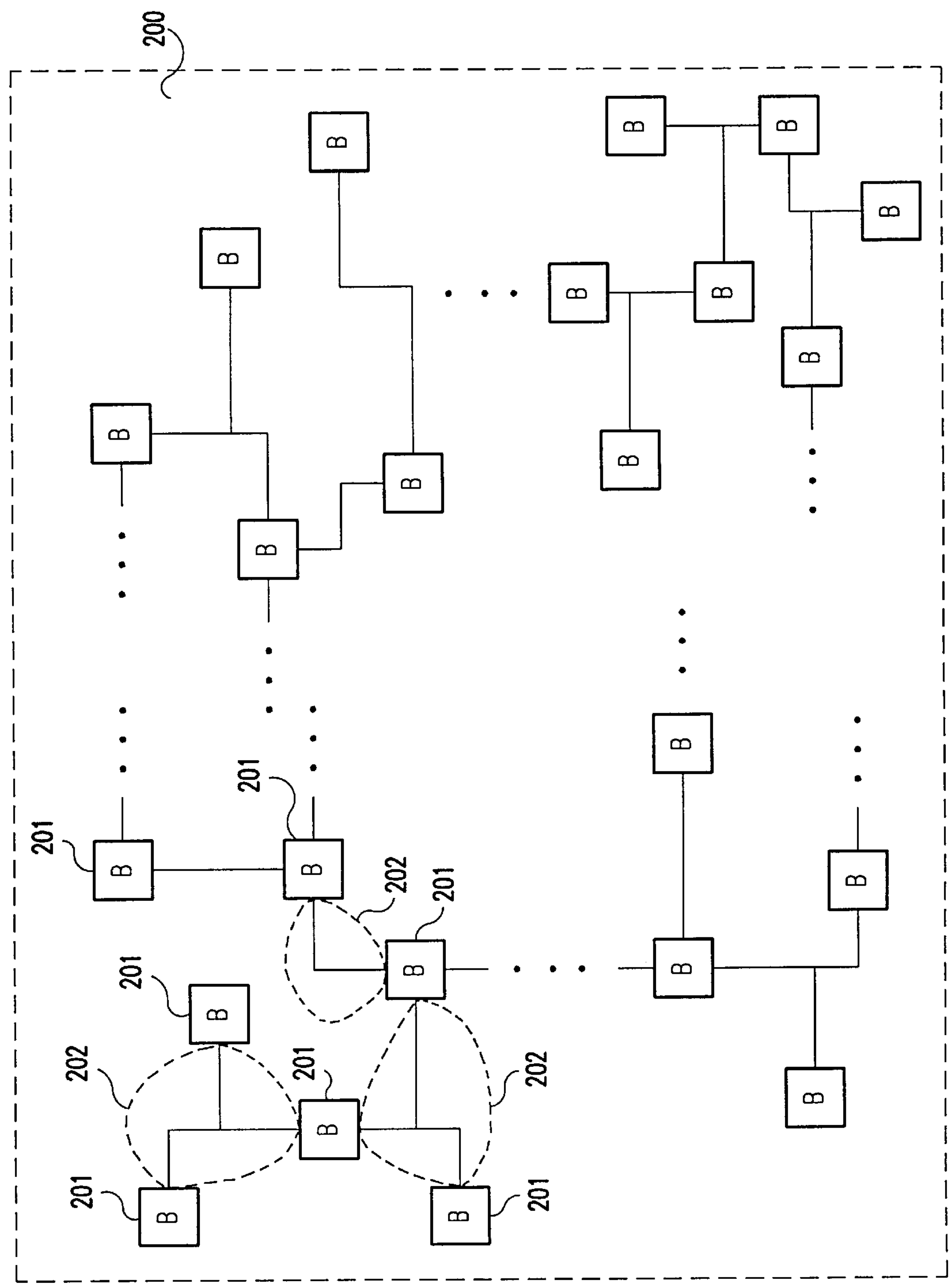
FIGS. 2(*a*) and 2(*b*) are block diagrams for describing layout information stored in a layout file and the hierarchical configuration of the integrated circuit design.
Figure 2B:
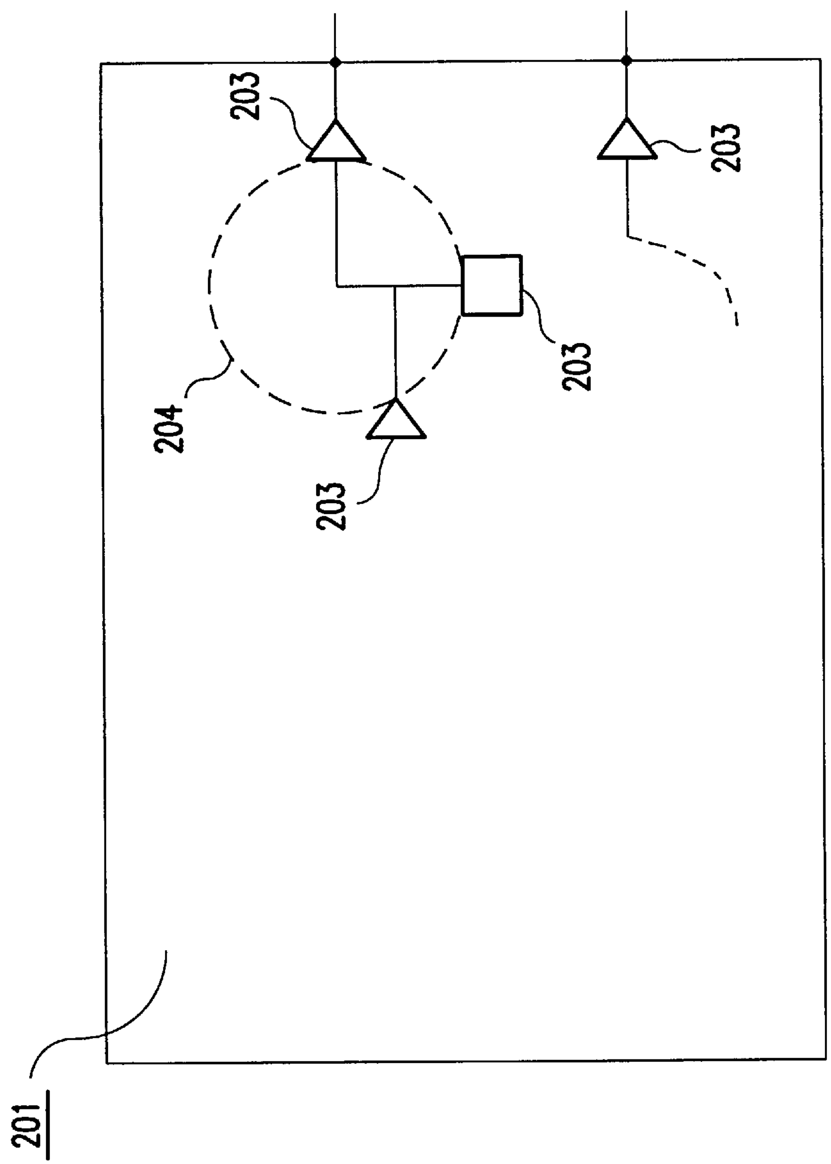

Reference is now made to FIGS. 2(*a*) and 2(*b*) to describe layout information stored in the layout file 104 and the hierarchical configuration of the integrated circuit design. As shown in FIG. 2(*a*), top-most level functional blocks B of a circuit design 200 are denoted by reference number 201. Typically, there may be anywhere from 10 to 50 or more of these top-most level blocks 201, which constitute the highest functional level of the chip layout hierarchy.

Extending between the top-most level blocks 201 are a large number of external nets 202. These external nets, which may number on the order of 10,000 for the entire chip layout, provide signaling, power, etc. between the top-most level blocks 201.

In addition, as shown in FIG. 2(*b*), within each block 201 are numerous low-level blocks 203 and internal nets 204. Again, there may be on the order of 10,000 internal nets 204 within each block. The low-level blocks may represent individual functional cells, or the low-level blocks 203 may themselves be divided in a hierarchy of blocks or functional cells, with corresponding lower level internal nets, and so on.

Returning to FIG. 1, the electromigration check system 100 also includes a capacitance file 106, a resistance file 108, and a library file 110. The capacitance file contains capacitance values for components (i.e., wires and contacts) of the integrated circuit design, whereas the resistance file contains resistance values for the components of the integrated circuit design. The library file 110 stores information on the functional cells. Specifically, the functional cells have a drive strength parameter associated therewith which is stored in the library file 110.

The electromigration check system 100 also includes a processing unit 102 which is coupled to the layout file 104, the capacitance file 106, the resistance file 108 and the library file 110 to retrieve information from these files. According to the invention, as explained in more detail below, starting from the lowest hierarchy of the design so far completed, the parasitic (resistance and capacitance) component values are propagated up. Then, at the top-most level, lumping algorithms are employed to calculate the parasitic values for all of the top-most level nets. These values are then passed back down to the lower levels and then at each level, the layout is checked using previously computed parasitic values and EM limits. As also explained below, a peak current, AC-average current and AC-rms current are calculated for every layout, and then compared with the process EM rules for violations. FIG. 1 illustrates the processing unit 102 as containing a parasitic processing unit 102*a* which first calculates the parasitics for the top-most level nets, these values being passed back down to the lower levels, and a layout processing unit 102*b* which checks the layout at each level for violations.

The processing unit 102 is additionally connected to the rules table 112 and the output error file 112. The rules table 112 contains the process rules for the fabrication process which are used to check for EM violations. Any violations can be stored in the output error file for use by interested parties.

The rules table 112 can take many different forms. In the present embodiment, the rules table has a structure that relates a peak current, AC-average current and AC-rms current, which are calculated for every layout, to a minimum wire or contact size.

Figure 3A:
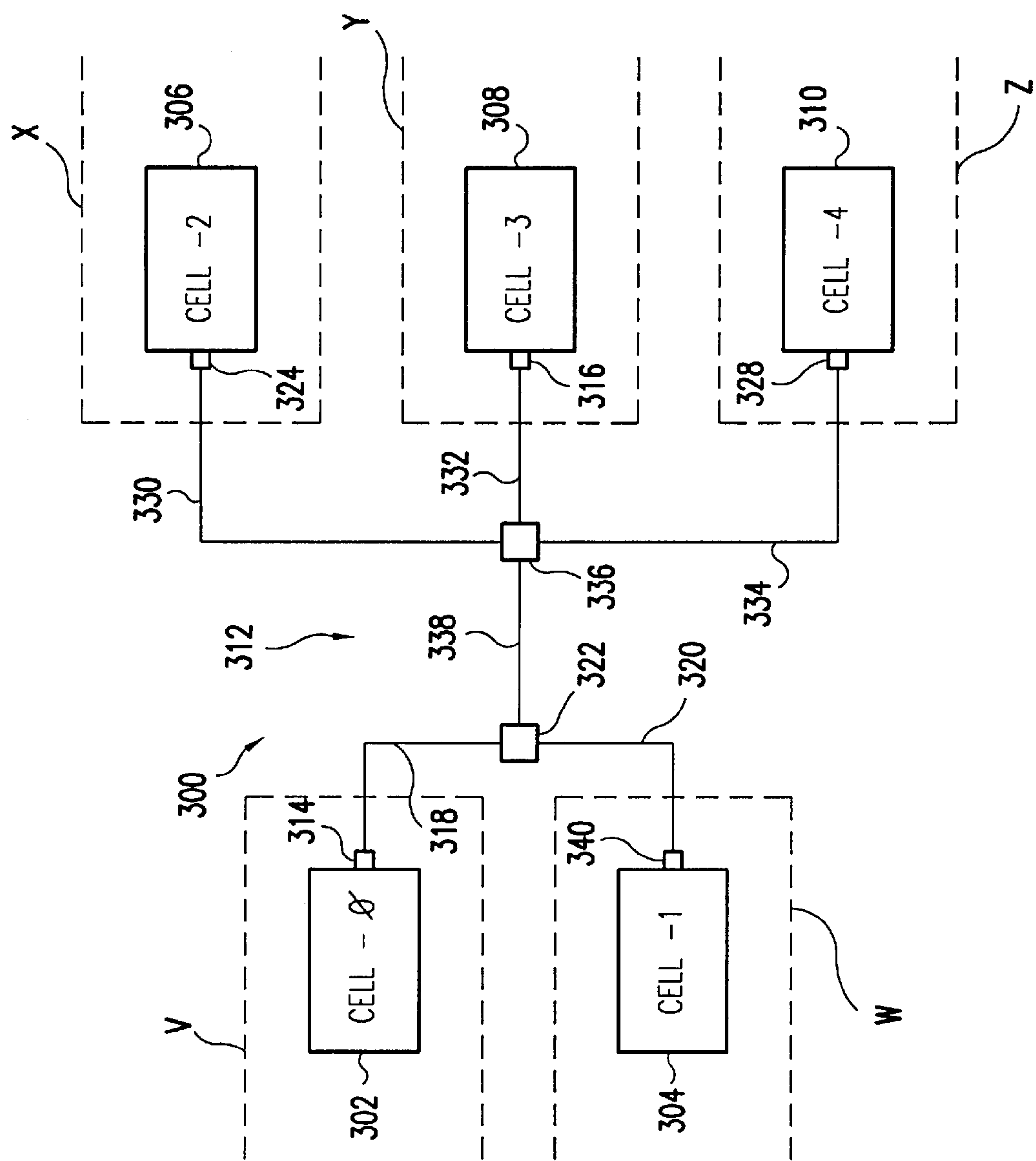
FIG. 3(*a*) is a schematic diagram of a representative external net connecting the high-level functional blocks of a designed chip layout.
Figure 3B:
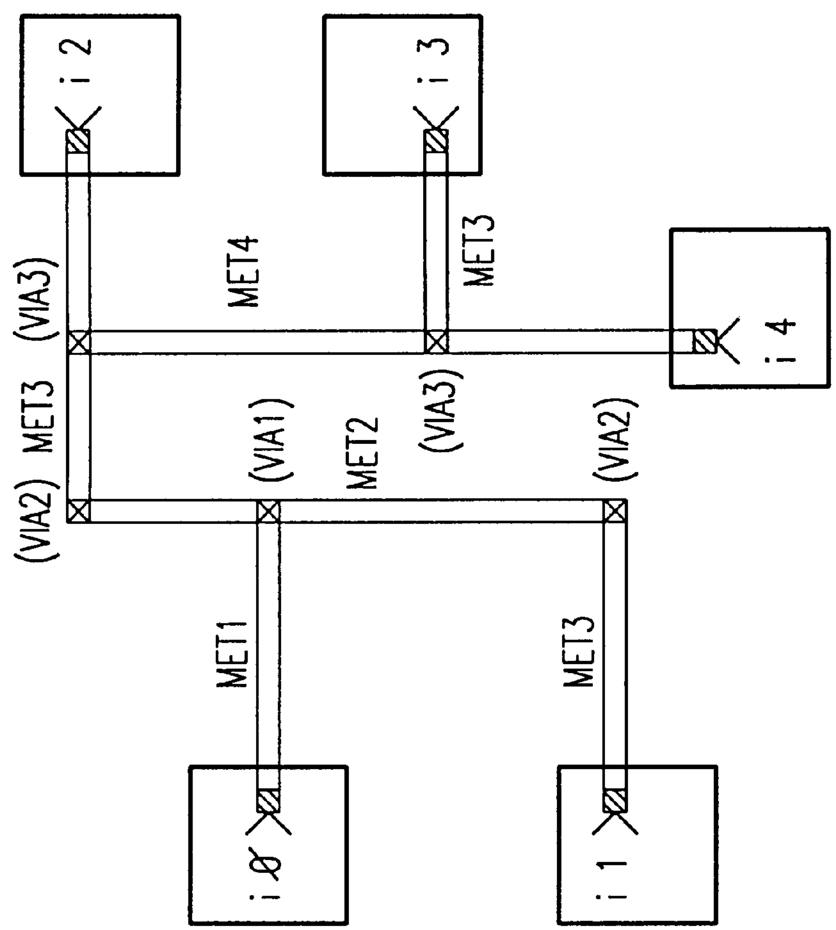

FIG. 3(*a*) is a schematic diagram of a representative external net 202 connecting the high-level functional blocks of a designed chip layout. The functional cells in the representative net include cell-0 302, cell-1 304, cell-2 306, cell-3 308 and cell-4 310. These functional cells 302–310 are interconnected by a net 312 and are respectively contained within the top-most level functional blocks V, W, X, Y and Z. The net is formed by various wires and contacts. The wires are also known as lines, and the contacts represent pads as well as vias.

The net 312 includes contacts 314 and 316. The contacts 314 and 316 are also output nodes or driving nodes as they are coupled to the cell-0 302 and the cell-1 304, respectively, which output or drive current into the remaining portion of the net 312. The contact 314 is connected to a wire 318, and the contact 316 is connected to a wire 320. The wire 318 and the wire 320 are then connected at a contact 322. The net 312 also includes contacts 324, 326 and 328. The contacts 324, 326 and 328 are input nodes as they receive current from the remaining portion of the net 312. The contact 324 is connected to a wire 330, the contact 326 is connected to a wire 332, and a contact 328 is connected to a wire 334. The wires 330, 332 and 334 are connected together at a contact 336. The contact 336 is also connected to the contact 322 by a wire 338. The contact 336 can also be considered an internal node of the net 312. The wires of the net 312 have defined dimensions (thickness and width) and the contacts have a defined size. Typically, with integrated circuit designs, the wires (also known as conductive traces or lines) can traverse and interconnect with different layers, such as a metal-1 layer, a metal-2 layer and a metal-3 layer. The contacts can be pads on a given layer with a size of a multiple of contacts, or vias which traverse the various layers to interconnect the wires and have a size of a multiple of vias. For example, a single contact or a double contact could be used, the double contact capable of safely carrying more current. Likewise, a single via or a double via could be used with the double capable of safely carrying more current.

FIG. 3(*b*) is a schematic diagram of a representative layout file 332. The layout file 332 is a conceptual view of the representative layout file for the representative net 300 shown in FIG. 5. The layout file 332 for the representative net 300 includes cells (i0–i4), metal layers (MET1, MET2, MET3 and MET4), and vias (VIA1, VIA2 and VIA3). In practice, the layout file 332 is an electronic file that describes the elements and interconnections for the representative net 300 using a predetermined set of rules. One provider of such layout software tools is Mentor Graphics, Inc.

Figure 4:
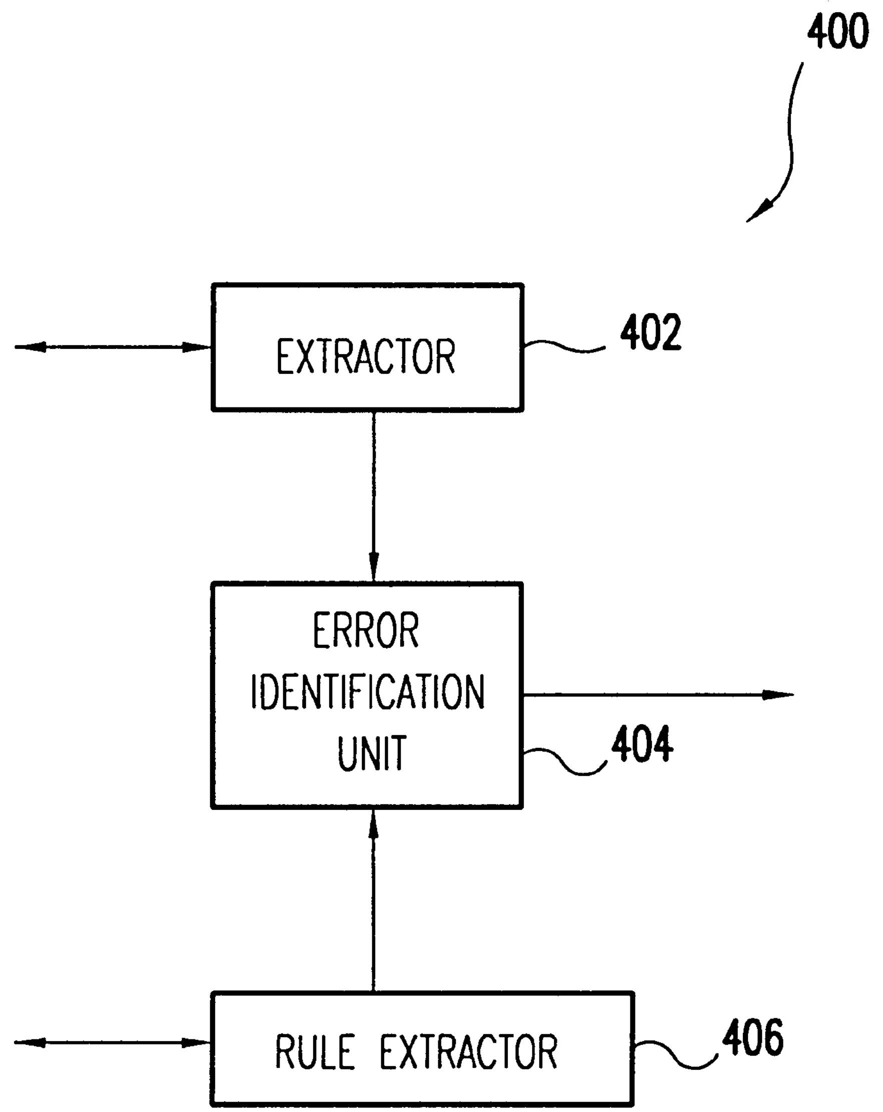
FIG. 4 is a diagram of a processing unit 400 according to an embodiment of the invention.
Figure 5A:
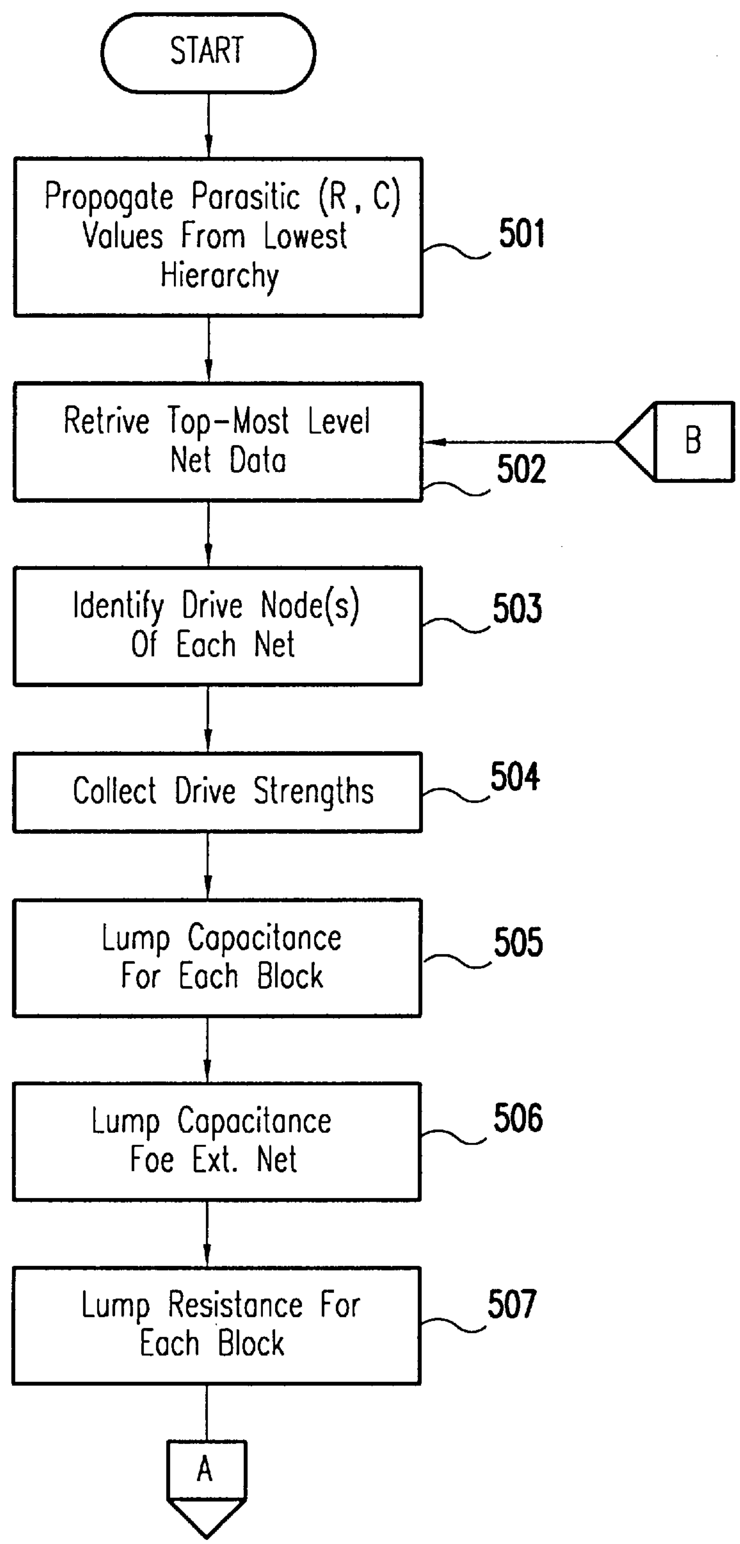
FIGS. 5(*a*)–5(*d*) are the flow diagrams illustrating the error identification processing performed according an embodiment of the present invention.
Figure 5B:
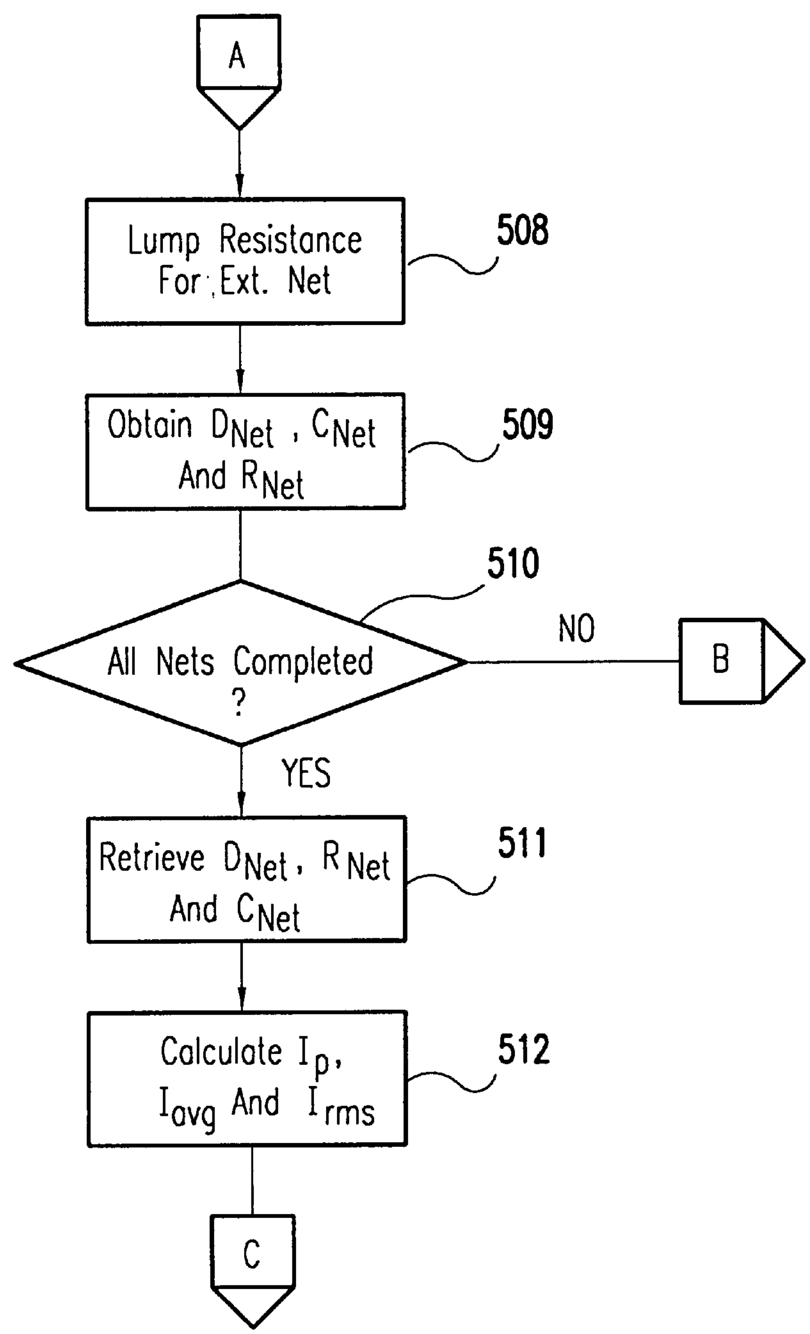
Figure 5C:
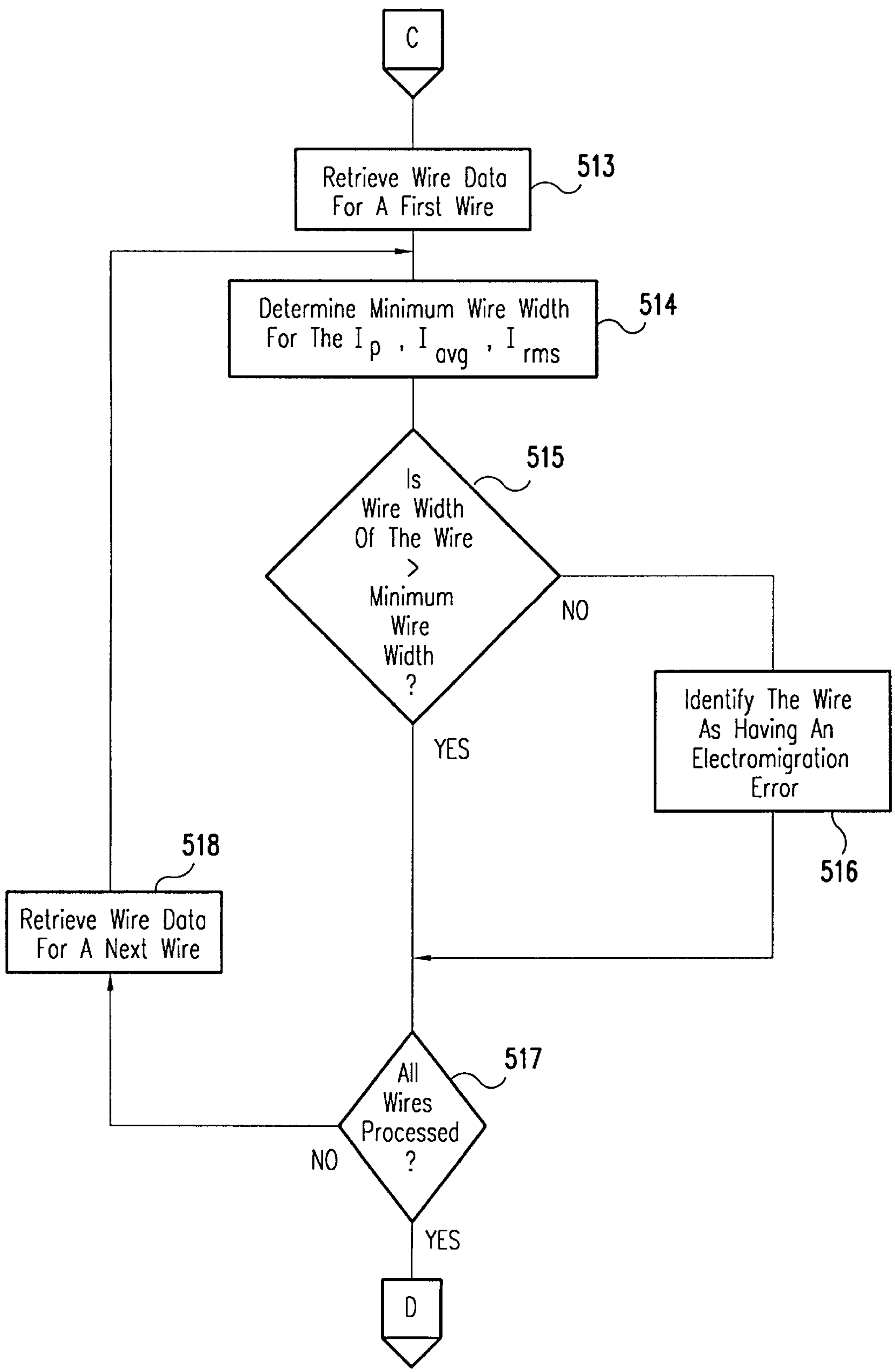
Figure 5D:
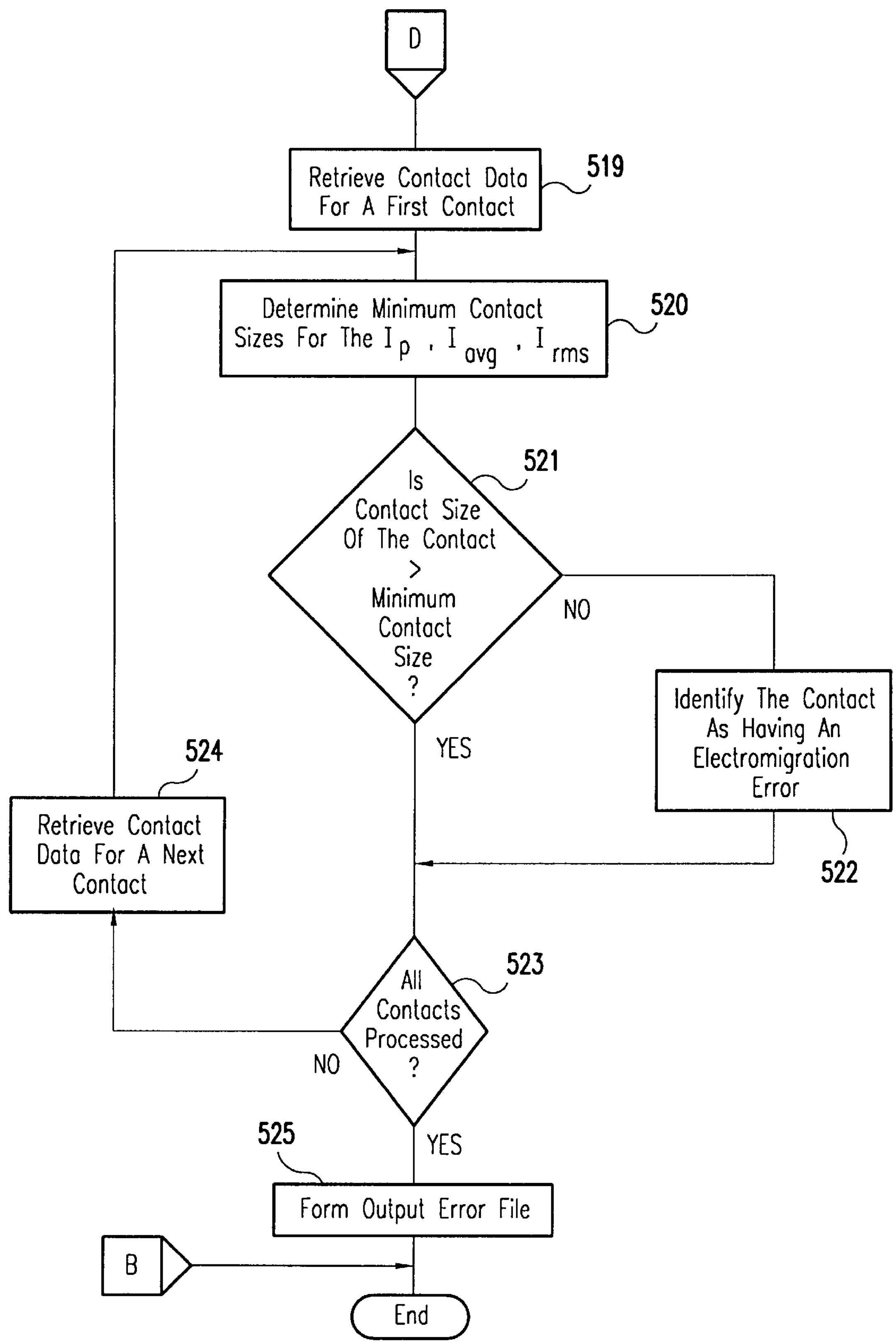

FIG. 4 is a diagram of a processing unit 400 according to an embodiment of the invention. The processing unit 400 is a detailed diagram of an exemplary implementation of the processing unit 102 illustrated in FIG. 1. The processing unit includes an extractor 402 for extracting the needed input information for the layout file 104, the capacitance file 106, the resistance file 108 and library file 110. The processing unit also includes a rule extractor 406. The rule extractor 406 operates to extract the appropriate process rules from the rules table 112. The processing unit 400 further includes an error identification unit 404. The extracted input information is forwarded by the extractor 402 to the error identification unit 404. The appropriate process rules information obtained by the rule extractor 406 is also forwarded to the error identification unit 404. The error identification unit 404 then identifies whether there are any violations or errors of the process rules by the integrated circuit design. The processing performed by the error identification unit 404 is described in detail below with respect to FIGS. 5(*a*) through 5(*d*).

FIGS. 5(*a*)–5(*d*) are the flow diagrams illustrating the error identification processing performed according an embodiment of the present invention. The error identification processing identifies violations of process rules for fabrication of an integrated circuit.

Figure 6:
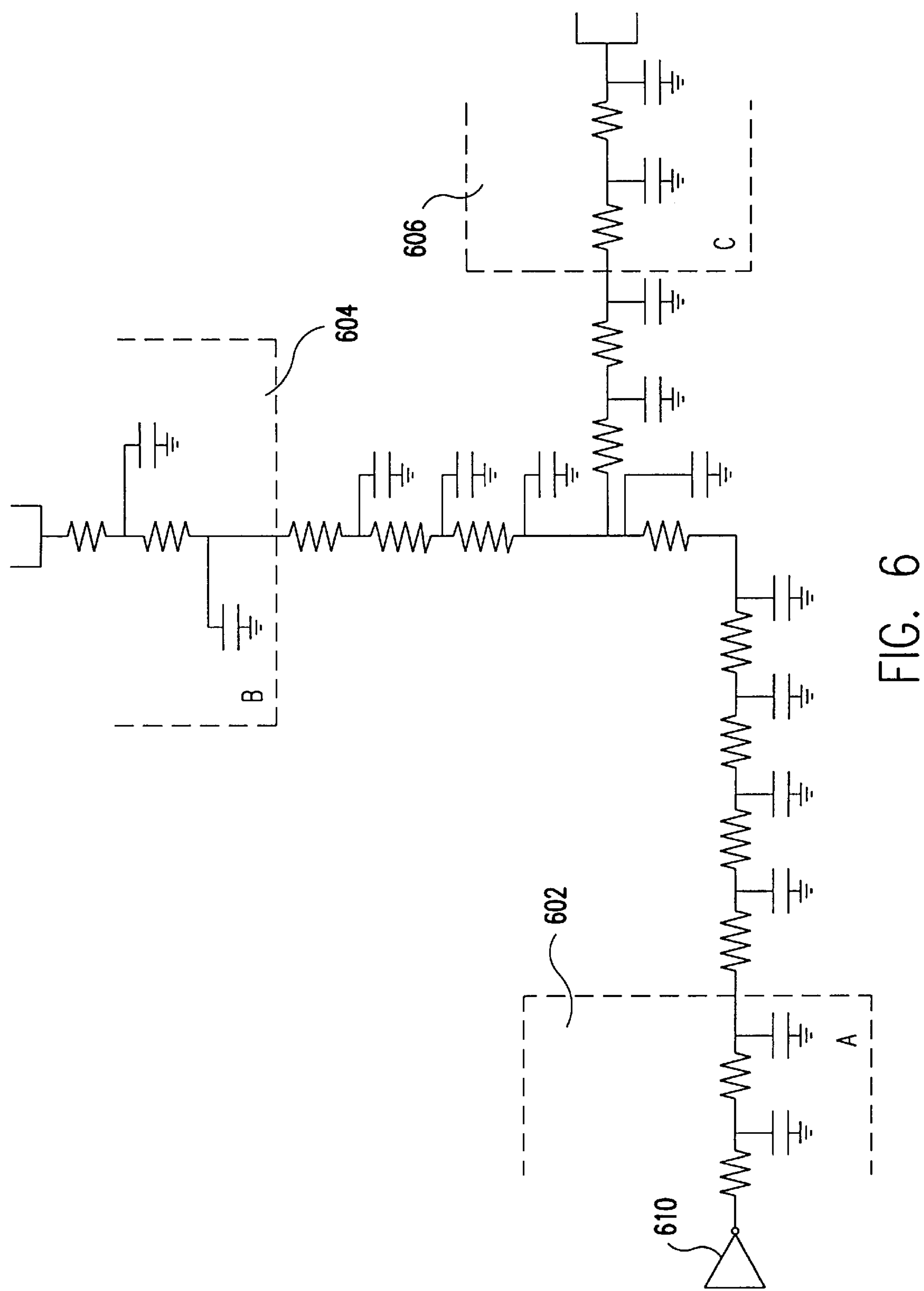
FIG. 6 is a diagram illustrating an example of the parasitic resistances and capacitances of a simplified top-level net.

In a first step 501, the parasitic processing unit 102*a* accesses the layout file, the capacitance file, and the resistance file, and propagates up the parasitic values of the chip layout. This is generally done from the lowest available hierarchy upward to the highest nets. FIG. 6 is a diagram illustrating an example of the parasitic resistances and capacitances of a simplified top-level net. Reference numeral 602, 604 and 606 denote top-level functional blocks of the chip layout. Again, there are typically 10 to 50 top-level blocks in a chip layout, with upwards of 10,000 top-level nets extending therebetween.

Then, in a next step 502, the top-level net data is retrieved. That is, again referring to the exemplary net of FIG. 6, the data regarding the external net extending between the blocks is retrieved, and the data regarding the parasitics and drive strengths within each of the blocks A, B and C are retrieved. In the illustrated example, block A had a single drive node 610 connected to the external net, whereas blocks B and C have no drive nodes connected to the external net. Driving nodes within the net data operate to drive the net. In a preferred embodiment, the driving nodes are identified by contacts (e.g., pads) that are identified as having an output type. Typically, the contacts with the output type connect functional cells to the net at so-called driving nodes. Hence, the identification of the contacts of the output type identifies the driving nodes.

In a next step 503, the driving nodes within each block are collapsed into a single drive node, and the drive strength for each collected driving node is determined in step 504. The drive strength can be determined using the drive strengths for the functional cells coupled to the driving nodes that are contained within the library file 108. That is, the library file 108 contains properties of functional cells, and one of these properties is the drive strength for the functional cell. The drive strength for the functional cells connected to the driving nodes can then be summed to determined the drive strength for the collected driving node of the block.

Next, a lumped capacitance for each block is obtained in step 505, and a lumped capacitance for the external net is obtained in step 506. The lumped capacitances can be obtained from the capacitance file 106. Preferably, the capacitance file 106 contains the capacitance value for each block portion of the net and for the external net portion of the net. This determined capacitance value effectively represents the collapsing of the parasitic capacitances within each block and within the external net into respective single capacitors. Commercially available software, such as Checkmate by Mentor Graphics, Inc. is able to determine the lumped capacitance within the block.

Then, a lumped resistance for each block is obtained in step 507, and a lumped resistance for the external net is obtained in step 508. Again, these values can be obtained from the resistance file 108. As with lumped capacitance, the lumped resistance effectively represents the collapsing of the parasitic resistances within the block and within the external net into respective single resistances.

Figure 7:
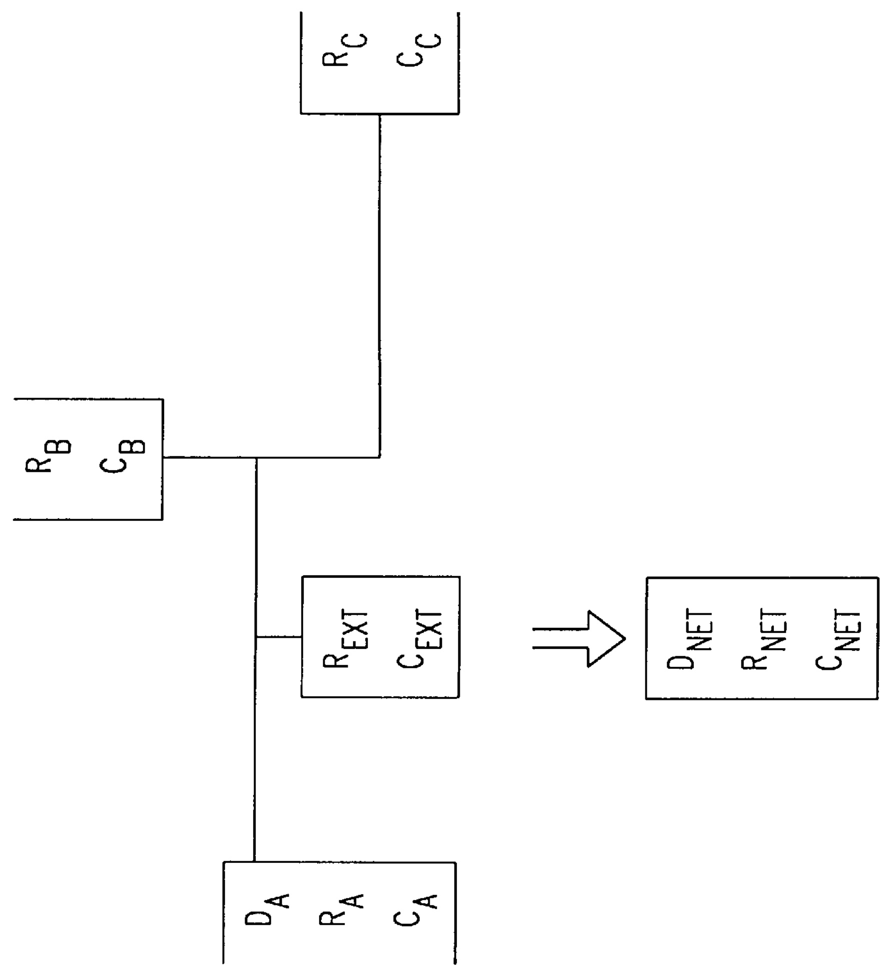
FIG. 7 conceptually illustrates the results of steps 503–508 of FIGS. 5(*a*) and 5(*b*) above.

FIG. 7 conceptually illustrates the results of steps 503–508 described above as applied to the example of the net of FIG. 6. In this drawing, $D_A$ is the collapsed drive strength of functional block A; $C_A$, $C_B$ and $C_C$ are the lumped capacitances of the respective functional blocks A, B and C; $C_{EXT}$ is the lumped capacitance of the external net portion of the net; $R_A$, $R_B$ and $R_C$ are the lumped resistances of the respective blocks A, B and C; and $R_{EXT}$ is the lumped resistance of the external net. This information is used to devise a uniform RC model for the interconnection that is equivalent to an RC distributed model that is more accurate than the simple lumped model.

In a next step 509, all lumped drives D are collected to determined a single drive strength $D_{NET}$ for the top-level net. Similarly, $C_A$, $C_B$, $C_C$ and $C_{EXT}$ are lumped to obtain a single lumped capacitance $C_{NET}$ for the top-level net. Finally, $R_A$, $R_B$, $R_C$ and $R_{EXT}$ are lumped to obtain a single lumped resistance $R_{NET}$ for the top-level net. This is also conceptually shown in FIG. 7, where $D_{NET}$, $C_{NET}$ and $R_{NET}$ for the top-level net are obtained.

In a preferred embodiment, the $D_{NET}$, $C_{NET}$ and $R_{NET}$ values for all of the top-level nets are obtained prior to advancing to the layout phase of the process. Thus, at a step 510, a determination is made as to whether the parasitics for all the top-level nets have been determined, and if not, the process returns to step 502 to subject another one of the top level nets to the parasitic analysis. Once all the $D_{NET}$, $C_{NET}$ and $R_{NET}$ values have been determined for each top-level net, these are stored as multiple net data structures of the top-level hierarchy of the chip layout. The process is now ready to proceed to the layout check executed by the layout processor 102*b* of FIG. 1.

At step 511, $D_{NET}$, $C_{NET}$ and $R_{NET}$ are retrieved for a selected one of the top-most level nets. These values were obtained in Steps 501–510 above.

The EM tool of the invention is used to check for peak current $I_p$, average current $I_{avg}$ and rms current $I_{rms}$ related EM violations on each net. Step 512 is directed to calculating these values which may be readily obtained from $D_{NET}$, $C_{NET}$ and $R_{NET}$. The peak current is calculated by an analytical expression that includes the influence of the interconnect series resistance.

The information for the width, length, metal level, resistance and capacitance for each interconnect segment is extracted from the layout. A uniform RC network is used to model the parasitics of the wires. The driver strength/output impedance for the rising and falling edges is obtained from timing models. These are determined by simulations carried out during the cell library and megacell characterization.

The average and rms currents may be calculated via simplified expressions using the capacitance and resistance values extracted from layout, the activity factor for each block, and technology dependent parameters.

Next, each of the wires within the net are checked for electromigration violations. Initially, wire data for a first wire is retrieved at step 513. Preferably, the wire data is retrieved from the layout file 104. For all the wires of the integrated circuit design, the thickness is assumed to be a predetermined thickness, and the width of the wires varies with the integrated circuit design but is indicated in the wire data. A minimum wire width for the peak current $I_p$, average current $I_{avg}$ and rms current $I_{rms}$ is then determined in step 514. Here, the peak current $I_p$, average current $I_{avg}$ and rms current $I_{rms}$ are preferably indexed into the rules table to obtain the minimum wire width.

Next, a decision is made at step 515 as to whether the wire width of the wire according to the integrated circuit design is greater than the minimum wire width. If not, the wire is identified at step 516 as having an electromigration error. Otherwise, the step 516 is bypassed since the wire width is deemed sufficient. It should be noted here that the minimum width allowed is for a particular current density which is defined by the EM rules rather than the process (fabrication) rules. That is, there exists a minimum width for fabrication purposes which may be different from the minimum width required to avoid EM violations.

A next step 517 asks whether all the wires for the net have been processed. In not, the wire data for a next wire is retrieved at step 518 and steps 514 through 517 are repeated. Once all wires of the net have been processed, the process proceeds to step 519 to check the contacts of the net for electromigration violations.

That is, each of the contacts within the net are checked for electromigration violations. Initially, contact data for a first contact is retrieved at step 519. Preferably, contact data is contained within the layout file 104. Also preferably, the contact data indicates a size of a contact as a multiple of a regular contact because this is how the contacts are formed. Namely, a double contact is formed from two regular (or single) contacts, one placed over the other. The double contact is capable of carrying current more safely than can the single contact. Again, the contact includes, for example, pads and vias.

Next, a minimum contact size for the peak current $I_p$, average current $I_{avg}$ and rms current $I_{rms}$ is determined at step 520. Here, the peak current $I_p$, average current $I_{avg}$ and rms current $I_{rms}$ are preferably used to index into the rules table 112 to obtain the minimum contact size. At step 521, a determination is made as to whether the contact size of the contact is greater than the minimum contact size. If not, the contact is identified at step 522 as having an electromigration violation. For example, if the contact size is one regular contact and the minimum size is two regular contacts (i.e., a double contact), then there is a violation of the process rules pertaining to electromigration. On the other hand, if the contact size of the contact is greater than or equal to the minimum contact size, then the contact is deemed not to have an electromigration error.

Step 523 is for determining whether all the contacts within the net have been processed. If all the contacts within the net have not been processed, then step 524 is executed to cause the contact data for a next contact to be retrieved, and to then repeat steps 520 through 523.

Once all contact have been processed, a top-level report for the net is formed at step 525. The format of the output error file can vary greatly but would be designed either for the user or as input to an integrated circuit layout tool which would allow the user to visually perceive the wires and contacts where violations occurred and/or automate the modifications needed to the integrated circuit design to avoid the electromigration errors which have been identified. Following step 525, the processing for the top-level net is complete. It is noted that step 513 through 525 would be carried out for each of the nets of the hierarchical level of the integrated circuit design under consideration.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A computer-implemented method for detecting electromigration violations in an integrated circuit design, the integrated circuit design having a functional hierarchy including a plurality of top-most level functional blocks each containing a plurality of functional cells, a plurality of external networks each interconnecting two or more of the top-most level functional blocks and together with the interconnected top-most level functional blocks forming a plurality of top-level nets, and further including a plurality of internal networks each contained within a respective one of the top-most level functional blocks and each interconnecting two or more functional cells within the respective one top-most level functional block, each of the external and internal networks including conductive signal traces and each of the functional cells having a drive strength associated therewith, said method comprising:

providing electromigration process rules for conductive signal traces of the integrated circuit design;

obtaining parasitic resistance and parasitic capacitance values for each conductive signal trace of the integrated circuit design;

propagating upward within the functional hierarchy the parasitic resistance and capacitance values of the conductive signal traces of the integrated circuit design;

determining a lumped resistance, a lumped capacitance and a lumped drive strength of each of the top-most level functional blocks;

determining a lumped resistance and lumped capacitance for each external network;

calculating at least one current value for each top-level net from the lumped resistance, the lumped capacitance and the lumped drive strength of the external networks and the top-most level functional blocks interconnected thereby;

determining minimum electromigration dimensions for the conductive signal traces of the integrated circuit design based on the at least one current value and said electromigration process rules for each of the top-level nets;

determining design dimensions of the conductive signal traces of the integrated circuit design;

comparing the design dimensions with the minimum electromigration dimensions; and identifying violations of the fabrication process rules for the conductive signal traces of the integrated circuit when the design dimensions are less than the minimum electromigration dimensions.

2. A computer implemented method as claimed in claim 1, wherein the at least one current value indicates a peak current, and average current and an rms current of each top-level net.

3. A computer implemented method as claimed in claim 1, further comprising forming a top-level output error file that includes information concerning violations in each top-level net of the functional hierarchy of the integrated circuit design.

* * * * *